US011095098B2

(12) United States Patent
Xia et al.

(10) Patent No.: US 11,095,098 B2
(45) Date of Patent: Aug. 17, 2021

(54) POWER SUPPLY CABINET

(71) Applicant: Delta Electronics (Shanghai) Co., Ltd., Shanghai (CN)

(72) Inventors: Yaoning Xia, Shanghai (CN); Hongguang Liu, Shanghai (CN); Yanying Wang, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 16/845,086

(22) Filed: Apr. 10, 2020

(65) Prior Publication Data

US 2020/0244052 A1  Jul. 30, 2020

Related U.S. Application Data

(62) Division of application No. 16/203,575, filed on Nov. 28, 2018, now Pat. No. 10,658,820.

(30) Foreign Application Priority Data

Dec. 11, 2017  (CN) .......................... 201721714895.0

(51) Int. Cl.
*G06F 1/26* (2006.01)
*H02J 9/00* (2006.01)
(Continued)

(52) U.S. Cl.
CPC .............. *H02B 1/34* (2013.01); *G06F 1/189* (2013.01); *G06F 1/263* (2013.01); *H02J 9/00* (2013.01);
(Continued)

(58) Field of Classification Search
CPC . H02B 1/34; G06F 1/189; G06F 1/263; H02J 9/00; H05K 7/1432; H05K 7/1457
See application file for complete search history.

(56) References Cited

U.S. PATENT DOCUMENTS 5,861,684 A * 1/1999 Slade ........................ H02J 1/06
307/66
7,586,211 B2 * 9/2009 Loffink .................... H02J 1/102
307/64

(Continued)

FOREIGN PATENT DOCUMENTS

CN     102522809 B    5/2015
CN     106249839 A   12/2016

*Primary Examiner* — Robert J Hoffberg
(74) *Attorney, Agent, or Firm* — CKC & Partners Co., LLC

(57) ABSTRACT

The present application provides a power supply cabinet, comprising a first power supply region and a second power supply region including at least one slot for receiving a first power supply module and a second power supply module respectively, a mode switching unit for outputting a mode signal to the first power supply module and the second power supply module, and a position setting unit for outputting a position signal to the first power supply module and the second power supply module. Input sides of the first power supply module and the second power supply mode are electrically connected to a first power supply and a second power supply. The power supply cabinet selectively operates in a first power supply mode (e.g. N+N mode) or a second power supply mode (e.g. N+1 mode) depending on the mode signal or types of the power supplies.

8 Claims, 3 Drawing Sheets

(51) Int. Cl.
*G06F 1/18* (2006.01)
*H02B 1/34* (2006.01)
*H05K 7/14* (2006.01)

(52) U.S. Cl.
CPC ......... *H05K 7/1432* (2013.01); *H05K 7/1457* (2013.01)

(56) References Cited

U.S. PATENT DOCUMENTS

| | | | |
|---|---|---|---|
| 9,459,674 B2* | 10/2016 | Lin | G06F 1/263 |
| 9,484,771 B2* | 11/2016 | Braylovskiy | H02J 9/061 |
| 9,696,776 B2* | 7/2017 | Yang | G06F 1/26 |
| 10,429,914 B2* | 10/2019 | Shaikh | H02J 3/06 |
| 10,658,820 B2* | 5/2020 | Xia | H02J 9/00 |
| 10,700,548 B2* | 6/2020 | Gu | G06F 1/263 |
| 2016/0357244 A1* | 12/2016 | Cudak | G06F 1/263 |
| 2020/0144855 A1* | 5/2020 | Chen | H02J 7/06 |

* cited by examiner

POWER SUPPLY CABINET

CROSS-REFERENCE TO RELATED APPLICATIONS

This is a divisional application of the U.S. application Ser. No. 16/203,575 filed on Nov. 28, 2018, which claims priority under 35 U.S.C. § 119(a) on Patent Application No. 201721714895.0 filed in P.R. China on Dec. 11, 2017, the entire contents of which are hereby incorporated by reference.

Some references, if any, which may include patents, patent applications and various publications, may be cited and discussed in the description of this application. The citation and/or discussion of such references, if any, is provided merely to clarify the description of the present application and is not an admission that any such reference is "prior art" to the application described herein. All references listed, cited and/or discussed in this specification are incorporated herein by reference in their entireties and to the same extent as if each reference was individually incorporated by reference.

BACKGROUND OF THE INVENTION

1. Field of the Application

The present application relates to a power supply cabinet, and specifically, to a power supply cabinet capable of operating in multiple power supply modes.

2. Related Art

Recently, an uninterruptible power supply generally operates in an N+N power supply mode or an N+1 power supply mode. Specifically, when the N+N power supply mode is used, (N+N) power supply modules are required in one power supply cabinet. Similarly, when the N+1 power supply mode is used, (N+1) power supply modules are required in one power supply cabinet.

For example, during normal operation of the uninterruptible power supply, the power supply cabinet in the N+N power supply mode may supply power to a group of N power supply modules through a first power supply, and supply power to the other group of N power supply modules through a second power supply. On the other hand, the power supply cabinet in the N+1 power supply mode may supply power to all the (N+1) power supply modules through the first power supply, leaving the second power supply as a back-up power supply.

At present, the conventional power supply cabinet may be either designed to be adapted for the N+N power supply mode, or designed to be adapted for the N+1 power supply mode, but could not incorporate both. When a user intends to change the power supply mode, the whole power supply cabinet has to be replaced, resulting in increased costs. Additionally, the replacement of power supply cabinet is time-consuming and is inconvenient to the user.

In view of this, it is highly demanded to develop a power supply cabinet that overcomes the above drawbacks.

SUMMARY OF THE INVENTION

An object of the present application is to provide a power supply cabinet, comprising: a first power supply region including at least one first slot, each for receiving a first power supply module, an input side of the first power supply module being electrically connected to a first power supply and a second power supply; a second power supply region including at least one second slot, each for receiving a second power supply module, an input side of the second power supply module being electrically connected to the first power supply and the second power supply; a mode switching unit electrically connected to the first power supply module and the second power supply module, for outputting a mode signal to the first power supply module and the second power supply module; and a position setting unit electrically connected to the first power supply module and the second power supply module, for outputting a position signal to the first power supply module and the second power supply module. The power supply cabinet may selectively operate in a first power supply mode or a second power supply mode depending on the mode signal.

Another object of the present application is to provide a power supply cabinet, comprising: a first power supply region including at least one first slot, each for receiving a first power supply module, an input side of the first power supply module being electrically connected to a first power supply and a second power supply; a second power supply region including at least one second slot, each for receiving a second power supply module, an input side of the second power supply module being electrically connected to the first power supply and the second power supply; and a position setting unit electrically connected to the first power supply module and the second power supply module, for outputting a position signal to the first power supply module and the second power supply module. The power supply cabinet may selectively operate in a first power supply mode or a second power supply mode depending on types of the first power supply and the second power supply The present application has the following advantages over the prior art. The power supply cabinet according to the present application may be adapted to various power supply modes. When it is required to change the power supply mode, the power supply cabinet according to the present application may be switched rapidly without replacing the whole power supply cabinet, which may reduce the cost, save the time for replacement, and improve the efficiency.

DETAILED DESCRIPTION OF THE INVENTION

The present application will be further described in detail with reference to the accompanying drawings and embodiments. Those embodiments are implemented according to the technical ideas of the present application. Although specific configuration and processes are described in those embodiments, the protection extent of the present application is not limited thereto.

Figure 1:
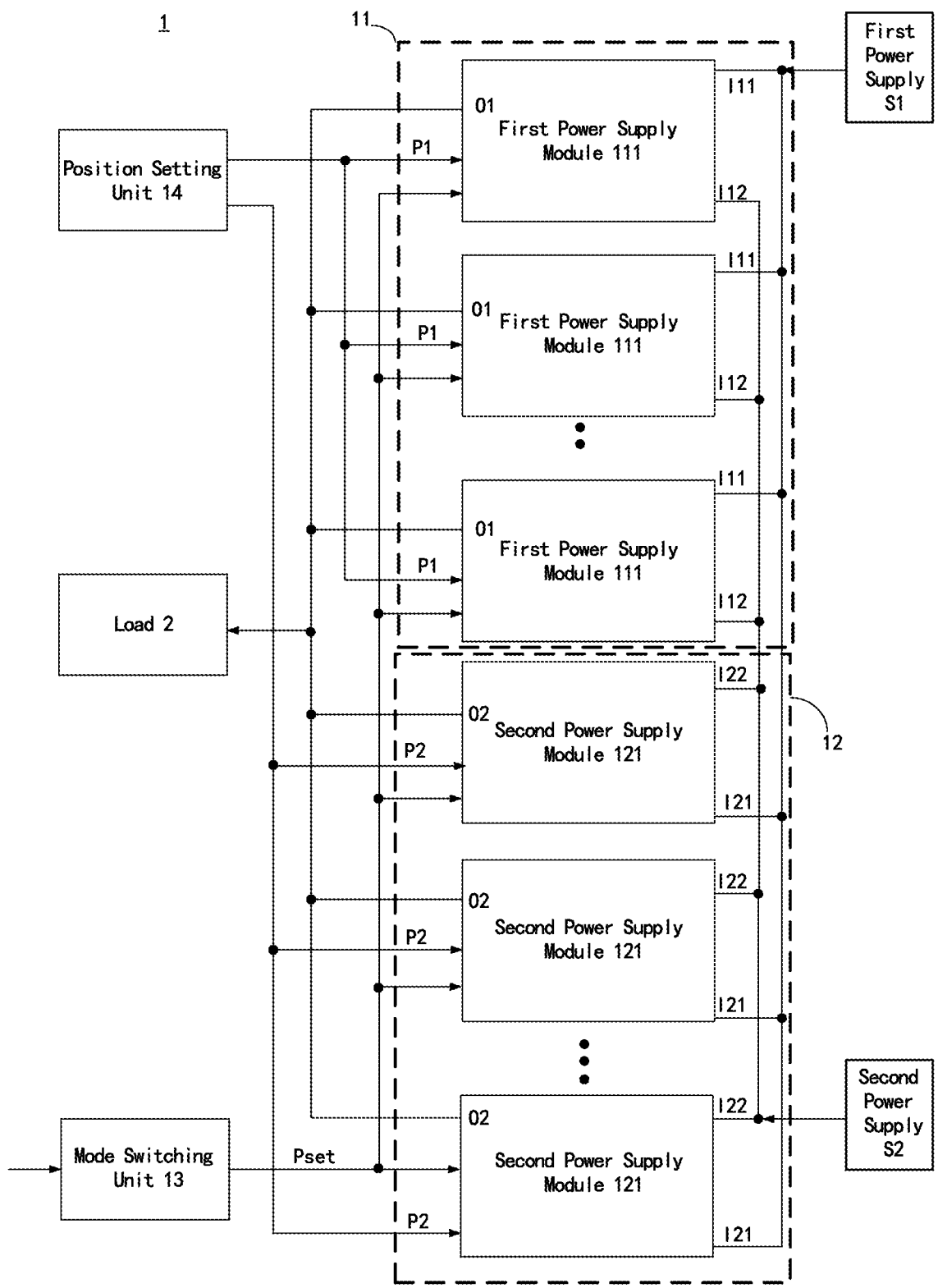
FIG. 1 is a structure diagram of a power supply cabinet according to a first embodiment of the present application.

Please refer to FIG. 1, which is a structure diagram of a power supply cabinet according to a first embodiment of the present application. The power supply cabinet according to the present application may be adapted to two power supply modes (N+N power supply mode and N+1 power supply mode). When it is required to change the power supply mode, the power supply cabinet according to the present application may be switched rapidly without replacing the whole power supply cabinet.

As shown in FIG. 1, the power supply cabinet 1 comprises a first power supply region 11 and a second power supply region 12. The first power supply region 11 includes at least one first slot (not shown), each for receiving a first power supply module 111. An input side of the first power supply module 111 is electrically connected to a first power supply S1 and a second power supply S2. The second power supply region 12 includes at least one second slot (not shown), each for receiving a second power supply module 121. An input side of the second power supply module 121 is also electrically connected to the first power supply S1 and the second power supply S2.

The power supply cabinet further comprises a mode switching unit 13 and a position setting unit 14. The mode switching unit 13 is electrically connected to the first power supply module 111 and the second power supply module 121, for outputting a mode signal Pset to the first power supply module 111 and the second power supply module 121. The position setting unit 14 is electrically connected to the first power supply module 111 and the second power supply module 121, for outputting a position signal to the first power supply module 111 and the second power supply module 121.

The power supply cabinet may selectively operate in a first power supply mode (e.g., N+N power supply mode) or a second power supply mode ((e.g., N+1 power supply mode), depending on the mode signal Pset. It is noted that each of the first power supply S1 and the second power supply S2 in the embodiment may be an AC power supply or a DC power supply. For example, the first power supply S1 and the second power supply S2 may both be AC power supplies, or both be DC power supplies, or may be an AC power supply and a DC power supply, respectively. Types of the first power supply S1 and the second power supply S2 are not limited.

Further, as shown in FIG. 1, the position signal outputted from the position setting unit 14 in the power supply cabinet 1 includes a first position signal P1 and a second position signal P2. In other words, the position setting unit 14 outputs the first position signal P1 to the first power supply module 111, and outputs the second position signal P2 to the second power supply module 121. The first position signal P1 and the second position signal P2 are different from each other so as to distinguish the first power supply region 11 and the second power supply region 12 in the power supply cabinet 1. In some embodiments, the position setting unit 14 may be disposed on a back plate of the power supply cabinet 1. For example, the position setting unit 14 has two terminals for supplying signals with opposite levels to the first power supply module 111 and the second power supply module 121, respectively, as the position signal P1 and the position signal P2. However, the present application is not limited thereto.

Further, referring to FIG. 1 again, output terminals O1 of the first power supply modules 111 and output terminals O2 of the second power supply modules 121 are electrically connected in parallel and then connected to a load 2, for supplying power to the load 2 commonly. On the other hand, each of the first power supply modules 111 may include a first input port I11 and a second input port I12 at input side. The first input port I11 and the second input port I12 are electrically connected to the first power supply S1 and the second power supply S2, respectively. Similarly, each of the second power supply modules 121 may include a first input port I21 and a second input port I22 at input side. The first input port I21 and the second input port I22 are electrically connected to the first power supply S1 and the second power supply S2, respectively.

Further, the first power supply region 11 and the second power supply region 12 include the same number of slots. For example, each of the first power supply region 11 and the second power supply region 12 includes at least N slots for receiving at least N power supply modules.

In this embodiment, the mode switching unit 13 is a dial switch. A user may change power supply mode of the power supply cabinet 1 by dialing the dial switch. For example, when the dial switch is connected to a high level, the power supply cabinet 1 may be switched to operate in a first power supply mode. When the dial switch is connected to a low level, the power supply cabinet may be switched to operate in a second power supply mode. However, the present application is not limited thereto.

Below, operation of the power supply cabinet 1 according to the present application is explained in details with reference to FIG. 1. In a case where the dial switch is used, for example, one terminal of the dial switch may be grounded (N+1 terminal) as a low level, while the other terminal may be floated (N+N terminal) as a high level. If the N+N power supply mode is required, the dial switch on the cabinet may be switched to the N+N terminal. Then, N power supply modules may be placed into the slots in each of the first power supply region and the second power supply region of the power supply cabinet, respectively. In a normal state, the first power supply modules 111 in the first power supply region 11 receive power from the first power supply S1, while the power supply modules 121 in the second power supply region 12 receive power from the second power supply S2. Power in each of the power supply modules 111 and 121 is ½N of the total power. If the N+1 power supply mode is required, the dial switch on the cabinet may be switched to the N+1 terminal. Then, N power supply modules are placed into the slots in the first power supply region of the power supply cabinet, while at least one power supply module is placed into at least one slot in the second power supply region of the power supply cabinet. In the normal state, the first power supply modules 111 in the first power supply region 11 receive power from the first power supply S1, while a certain power supply module 121 in the second power supply region 12 receives power from the first power supply S1. Power in each of the power supply modules 111 and 121 is 1/(N+1) of the total power.

Further, operation of the power supply cabinet 1 in a failure state is briefly explained below. As for the power supply cabinet operating in the first power supply mode, for example, if the power from the first power supply S1 is lost, the first power supply modules 111 in the first power supply region 11 may be switched to receive power from the second power supply S2, while the second power supply modules 121 in the second power supply region 12 still receive power from the second power supply S2. In this way, the power output to the load is still stable. Similarly, as for the power supply cabinet operating in the second power supply mode, for example, if the power from the first power supply S1 is lost, all the power supply modules 111 and 121 are switched to receive power from the second power supply S2. In this way, the power output to the load is still stable. As a result, power in each of the power supply modules 111 and 121 is still 1/(N+1) of the total power.

Therefore, regardless of the normal state or the failure state, the power supply cabinet according to the present application may satisfy power supply requirements at the load side in both power supply modes.

Figure 3:
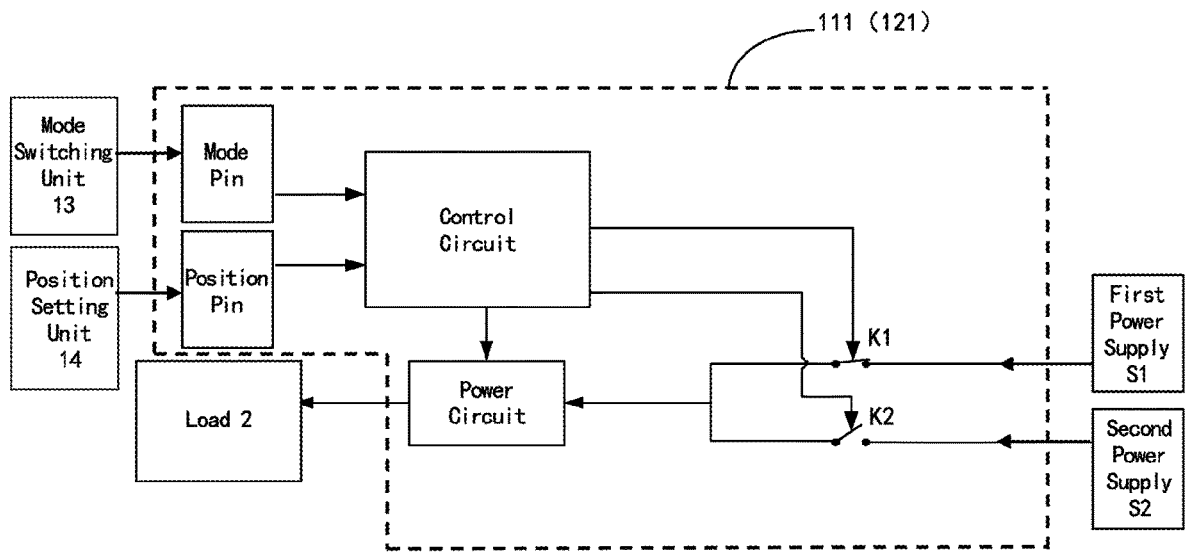
FIG. 3 is a structure diagram of the power supply module in the power supply cabinet according to the first embodiment of the present application.

Please refer to FIG. 3, which is a structure diagram of the power supply module in the power supply cabinet according to the first embodiment of the present application. The structure shown in FIG. 3 may be applied to either of the first power supply modules 111 and the second power supply modules 121 in FIG. 1. Specifically, as shown in FIG. 3, each of the first power supply module 111 and the second power supply module 121 may include a power circuit electrically connected to the load 2, a mode pin electrically connected to the mode switching unit 13, a position pin electrically connected to the position setting unit 14, and a control circuit electrically connected to the mode pin and the position pin. The control circuit receives the mode signal through the mode pin and receives the position signal through the position pin, and outputs a status signal according to the mode signal and the position signal. The power circuit may selectively receive power from the first power supply S1 or from the second power supply S2 depending on the status signal from the control circuit. In this embodiment, the control circuit is a digital control circuit, but the present application is not limited thereto.

Further, referring to FIG. 3 again, each of the first power supply module 111 and the second power supply module 121 may further include a first switching circuit K1 electrically connected to the first power supply S1 and the power circuit, and a second switching circuit K2 electrically connected to the second power supply S2 and the power circuit. Moreover, the status signal outputted from the control circuit includes a first switching signal and a second switching signal. The control circuit electrically connected to the first switching circuit K1 and the second switching circuit K2 outputs the first switching signal to the first switching circuit K1, and outputs the second switching signal to the second switching circuit K2, such that the first switching circuit K1 and the second switching circuit K2 are in complementary conduction. When the first switching circuit K1 is turned on, the power circuit is electrically connected to the first power supply S1, and when the second switching circuit K2 is turned on, the power circuit is electrically connected to the second power supply S2.

For example, when the power supply cabinet operates in the normal state and the first power supply mode is selected, the control circuit in the first power supply module 111 may output a status signal to the first switching circuit K1 and the second switching circuit K2 according to a mode signal representing the first power supply mode and a position signal representing the first power supply region, such that the first switching circuit K1 in the first power supply module 111 is turned on, and the second switching circuit K2 in the first power supply module 111 is turned off. Thus, the power circuit in the first power supply module 111 receives power from the first power supply S1. Meanwhile, the control circuit in the second power supply module 121 outputs a status signal to the first switching circuit K1 and the second switching circuit K2 according to a mode signal representing the first power supply mode and a position signal representing the second power supply region, such that the first switching circuit K1 in the second power supply module 121 is turned off, and the second switching circuit K2 in the second power supply module 121 is turned on. Thus, the power circuit in the second power supply module 121 receives power from the second power supply S2.

Similarly, when the power supply cabinet operates in the normal state and the second power supply mode is selected, the first switching circuit K1 in each of the first power supply module 111 and the second power supply module 121 is turned on, while the second switching circuit K2 in each of the first power supply module 111 and the second power supply module 121 is turned off. As a result, the power circuit in each of the first power supply module 111 and the second power supply module 121 receives power from the first power supply S1. Detailed description for the specific operation process is omitted here.

On the other hand, when the power supply cabinet 1 operates in the failure state, the switching of power may be implemented similarly through the operations of the switching circuits. Detailed description for the specific operation process is omitted here.

The first switching circuit K1 and the second switching circuit K2 may be implemented as relays, switching devices, or the like, but the present application is not limited thereto.

It is noted that the power supply module in the power supply cabinet according to the first embodiment of the present application may alternatively employ other configurations, as long as the power supply module is capable of selectively receiving power from the first power supply or the second power supply according to the mode signal and the position signal.

Figure 2:
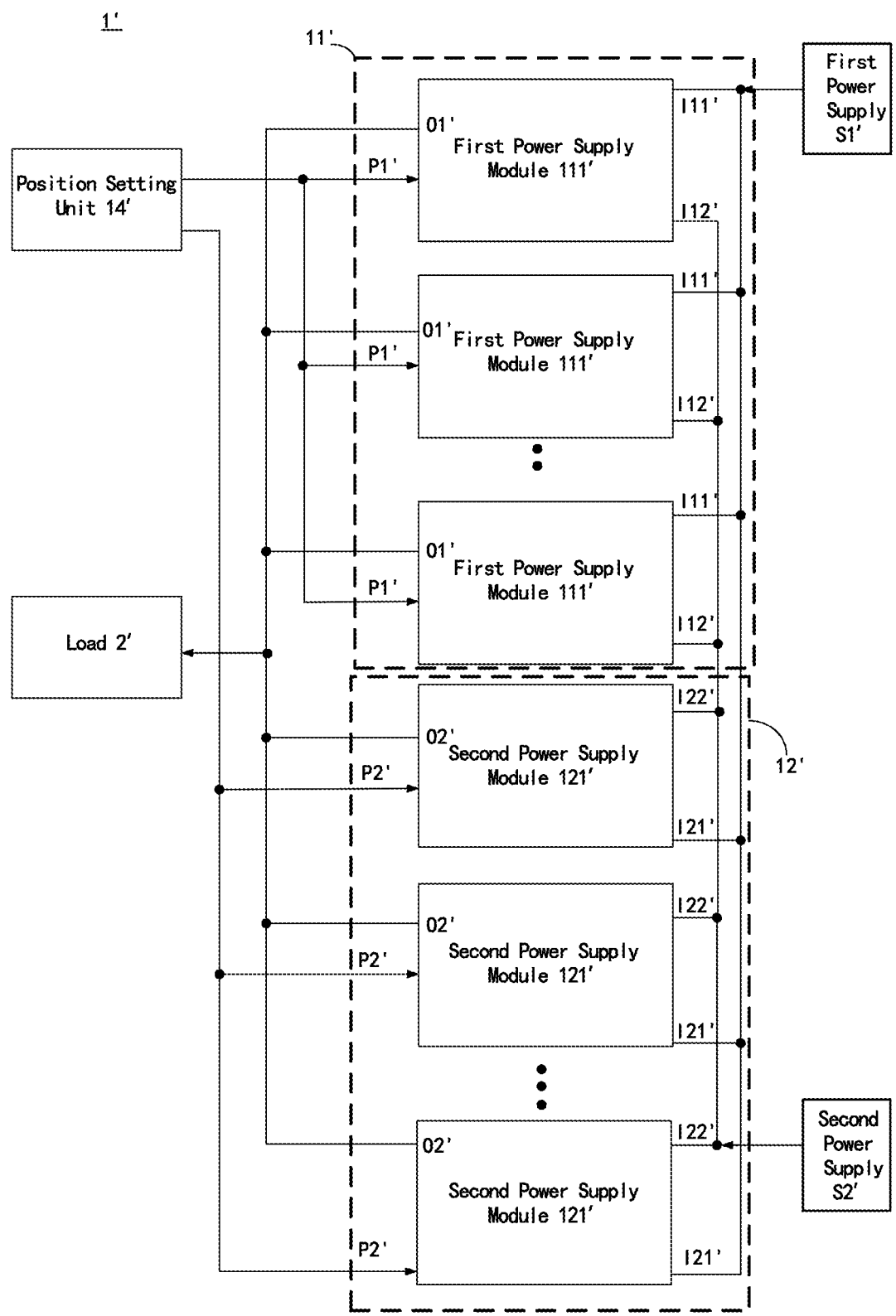
FIG. 2 is a structure diagram of the power supply cabinet according to a second embodiment of the present application.

Please refer to FIG. 2, which is a structure diagram of the power supply cabinet according to a second embodiment of the present application. As shown in FIG. 2, the power supply cabinet 1' according to the present application may be adapted to multiple power supply modes (N+N or N+1). When a user intends to change the power supply mode, the power supply cabinet 1' may be switched and adjusted rapidly to the intended power supply mode, so as to supply power to the load 2'.

As shown in FIG. 2, the power supply cabinet 1' comprises a first power supply region 11' and a second power supply region 12'. The first power supply region 11' includes at least one first slot (not shown), each for receiving a first power supply module 111'. An input side of the first power supply region 11' is electrically connected to a first power supply S1' and a second power supply S2'. The second power supply region 12' includes at least one second slot (not shown), each for receiving a second power supply module 121'. An input side of the second power supply module 121' is electrically connected to the first power supply S1' and the second power supply S2'.

The power supply cabinet 1' further comprises a position setting unit 14', which is electrically connected to the first power supply module 111' and the second power supply module 121', for outputs a position signal to the first power supply module 111' and the second power supply module 121'.

The power supply cabinet 1' may selectively operate in a first power supply mode or a second power supply mode depending on types of the first power supply S1' and the second power supply S2'. For example, when both the first power supply S1' and the second power supply S2' are AC power supplies, the power supply cabinet 1' may be switched to operate in the first power supply mode. When the first power supply S1' is an AC power supply and the second power supply S2' is a DC power supply, the power supply cabinet 1' may be switched to operate in the second power supply mode. However, the present application is not limited thereto, as long as types of the first power supply S1' and the second power supply S2' are different from each other.

Further, the position signal outputted from the position setting unit 14' includes a first position signal P1' and a second position signal P2'. In other words, the position setting unit 14' outputs the first position signal P1' to the first power supply module 111', and outputs the second position signal P2' to the second power supply module 121'. The first position signal P1' and the second position signal P2' are different from each other so as to distinguish the first power supply region 11' and the second power supply region 12' in the power supply cabinet 1'. In some embodiments, the position setting unit 14' may be disposed on a back plate of the power supply cabinet 1'. For example, the position setting unit 14' has two connecting terminals for supplying signals with opposite levels to the first power supply module 111' and the second power supply module 121', respectively, as the position signal P1' and the position signal P2'. However, the present application is not limited thereto.

Further, referring to FIG. 2 again, output terminals O1' of the first power supply modules 111' and output terminals O2' of the second power supply modules 121' are electrically connected to a load 2' for supplying power to the load 2' commonly. On the other hand, each of the first power supply modules 111' may include a first input port 111' and a second input port 112' at input side. The first input port 111' and the second input port 112' are electrically connected to the first power supply S1' and the second power supply S2', respectively. Similarly, each of the second power supply modules 121' may include a first input port 121' and a second input port 122' at input side. The first input port 121' and the second input port 122' are electrically connected to the first power supply S1' and the second power supply S2', respectively.

Further, the first power supply region 11' and the second power supply region 12' include the same number of slots. For example, each of the first power supply region 11' and the second power supply region 12' includes at least N slots for receiving at least N power supply modules.

As compared to the first embodiment, the power supply cabinet 1' in the second embodiment is not provided with a mode setting unit. Instead, the power supply cabinet 1' may selectively operate in the first power supply mode or the second power supply mode depending on the types of the power supplies directly.

Figure 4:
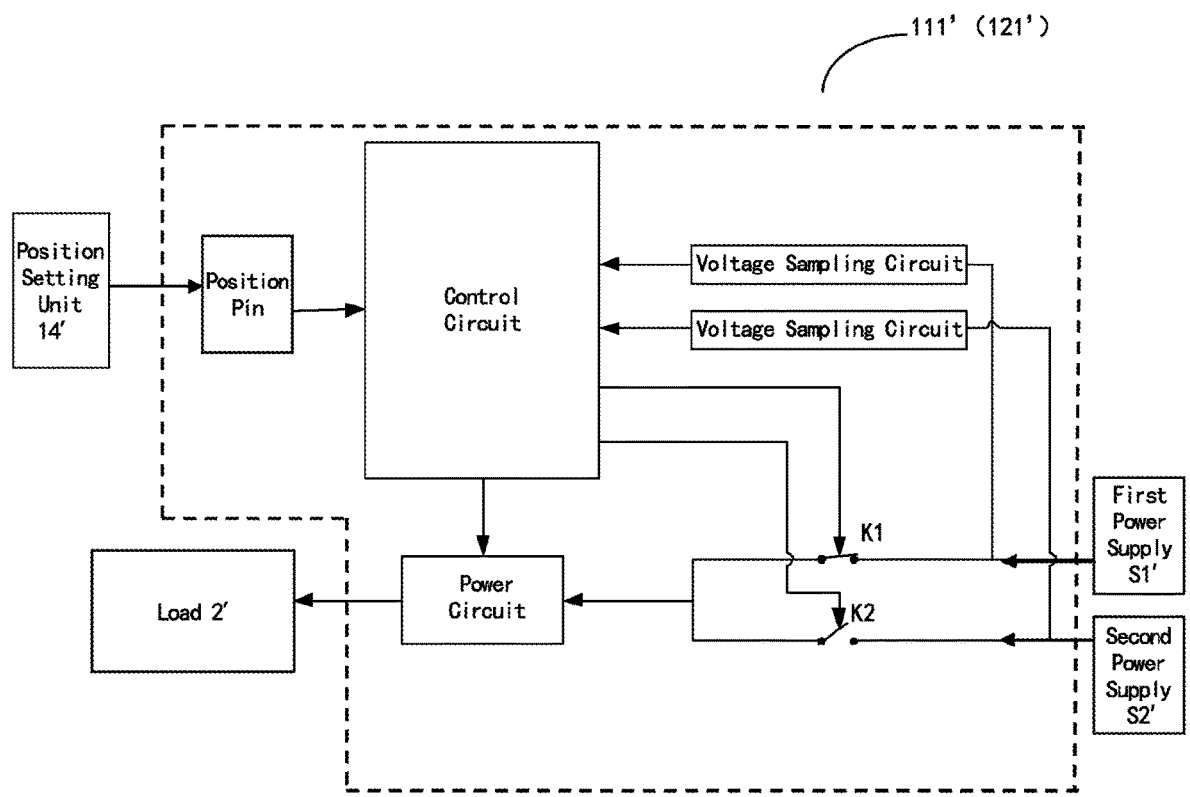
FIG. 4 is a structure diagram of the power supply module in the power supply cabinet according to the second embodiment of the present application.

Please refer to FIG. 4, which is a structure diagram of the power supply module in the power supply cabinet according to the second embodiment of the present application. The structure of the power supply module shown in FIG. 4 is substantially the same as that shown in FIG. 3. Accordingly, description for similar elements in FIG. 4 will be omitted. The following description will only focus on different parts.

The structure shown in FIG. 4 may be applied to either of the first power supply modules 111' and the second power supply modules 121' in FIG. 2. Specifically, as shown in FIG. 4, each of the first power supply module 111' and the second power supply module 121' may include a power circuit electrically connected to the load 2', a position pin electrically connected to the position setting unit 14', sampling circuits electrically connected to the first power supply S1' and the second power supply S2' for obtaining sampling signals of the first power supply S1' and the second power supply S2', and a control circuit electrically connected to the position pin and the sampling circuits. The control circuit receives the position signal through the position pin, and receives the sampling signals such as voltage sampling signals from the sampling circuits, and outputs a status signal according to the sampling signals and the position signal. Specifically, the control circuit determines types of the first power supply S1' and the second power supply S2' depending on the sampling signals, generates a status signal with reference to the position signal, and outputs the status signal. The power circuit may selectively receive power from the first power supply S1' or the second power supply S2' depending on the status signal from the control circuit. In this embodiment, the control circuit is a digital control circuit, but the present application is not limited thereto.

It is noted that the user may set the judgment logic of the control circuit as needed. For example, the user may set it as follows. When the control circuit determines that both the first power supply S1' and the second power supply S2' are AC power supplies according to the sampling signals, the control circuit may output a status signal corresponding to the first power supply mode. When the control circuit determines that the first power supply S1' is an AC power supply and the second power supply S2' is a DC power supply according to the sampling signals, the control circuit may output a status signal corresponding to the second power supply mode.

Further, referring to FIG. 4 again, and similar to FIG. 3, each of the first power supply module 111' and the second power supply module 121' may further include a first switching circuit K1 electrically connected to the first power supply S1' and the power circuit, and a second switching circuit K2 electrically connected to the second power supply S2' and the power circuit. Moreover, the status signal outputted from the control circuit includes a first switching signal and a second switching signal. The control circuit may output the first switching signal to the first switching circuit K1, and output the second switching signal to the second switching circuit K2, such that the first switching circuit K1 and the second switching circuit K2 are in complementary conduction. When the first switching circuit K1 is turned on, the power circuit is electrically connected to the first power supply S1', and when the second switching circuit K2 is turned on, the power circuit is electrically connected to the second power supply S2'.

With the judgment logic mentioned above as an example, in a case where both the first power supply S1' and the second power supply S2' are AC power supplies, when the power supply cabinet 1' operates in the normal state, the control circuit in the first power supply module 111' may output a status signal to the first switching circuit K1 and the second switching circuit K2 according to the sampling signals and a position signal representing the first power supply region, such that the first switching circuit K1 in the first power supply module 111' is turned on, and the second switching circuit K2 in the first power supply module 111' is turned off. Thus, the power circuit in the first power supply module 111' receives power from the first power supply S1'. Meanwhile, the control circuit in the second power supply module 121' outputs a status signal to the first switching circuit K1 and the second switching circuit K2 according to the sampling signals and a position signal representing the second power supply region, such that the first switching circuit K1 in the second power supply module 121' is turned off, and the second switching circuit K2 in the second power supply module 121' is turned on. Thus, the power circuit in the second power supply module 121' receives power from the second power supply S2'.

Similarly, in a case where the first power supply S1' is an AC power supply and the second power supply S2' is a DC power supply, when the power supply cabinet operates in the normal state, the first switching circuit K1 in each of the first power supply module 111' and the second power supply module 121' is turned on, while the second switching circuit K2 in each of the first power supply module 111' and the second power supply module 121' is turned off. As a result, the power circuit in each of the first power supply module 111' and the second power supply module 121' receives power from the first power supply S1'. Detailed description for the specific operation process is omitted here.

On the other hand, when the power supply cabinet 1' operates in the failure state, the switching of power may be implemented similarly through the operations of the switching circuits. Detailed description for the specific operation process is omitted here.

The first switching circuit K1 and the second switching circuit K2 may be implemented as relays, switching devices, or the like, but the present application is not limited thereto.

It is noted that the power supply module in the power supply cabinet according to the second embodiment of the present application may alternatively employ other configurations, as long as the power supply module is capable of selectively receiving power from the first power supply or the second power supply according to the types of the power supplies and the position signal.

To sum up, the power supply cabinet according to the present application may be adapted to various power supply modes. When it is required to change the power supply mode, the power supply cabinet according to the present application may be switched rapidly without replacing the whole power supply cabinet, which may reduce the cost, save the time for replacement, and improve the efficiency.

It is to be noted that the above embodiments are only used to illustrate the present application but not to limit the technical solution described in the present application; moreover, although the present application is described in detail with reference to the above embodiments in this specification, the ordinary persons skilled in the art should understand that changes or equivalent substitutions can still be made to the present application; thus, all the technical solutions not departing from the spirit and scope of the present application and the improvements thereof should be covered by the protection scope of the appended claims of the present application.

What is claimed is:

1. A power supply cabinet, comprising:
   a plurality of power supply modules, an input side of each of the power supply modules being electrically connected to a first power supply and a second power supply, each of the power supply modules determines a type of power supplied by a first power supply and a type of power supplied by a second power supply;
   a first power supply region including at least one first slot, each at least one first slot for receiving a first one of the power supply modules;
   a second power supply region including at least one second slot, each at least one second slot for receiving a second one of the power supply modules; and
   a position setting unit electrically connected to each of the power supply modules, for outputting a position signal to each of the power supply modules to identify whether each of the power supply modules is disposed in the first power supply region or the second power supply region,
   wherein the power supply cabinet selectively operates in a first power supply mode or a second power supply mode depending on the type of power supplied by the first power supply and the type of power supplied by the second power supply.

2. The power supply cabinet according to claim 1, wherein the position signal includes a first position signal and a second position signal which are different from each other, and wherein, the position setting unit outputs the first position signal to the first one of the power supply modules, and outputs the second position signal to the second one of the power supply modules.

3. The power supply cabinet according to claim 1, wherein an output terminal of the first one of the power supply modules and an output terminal of the second one of the power supply modules are electrically connected in parallel and then connected to a load.

4. The power supply cabinet according to claim 1, wherein a number of the at least one first slot is a same as a number of the at least one second slot.

5. The power supply cabinet according to claim 1, wherein each of the power supply modules includes:
   a power circuit electrically connected to a load;
   a position pin electrically connected to the position setting unit;
   sampling circuits, each of the sampling circuits electrically connected respectively to one of the first power supply and the second power supply, for obtaining a respective one of sampling signals corresponding to the first power supply or the second power supply; and
   a control circuit electrically connected to the position pin and each of the sampling circuits,
   wherein the control circuit receives the position signal through the position pin and receives the sampling signals from the sampling circuits, and outputs a status signal according to the sampling signals and the position signal, and
   wherein the power circuit selectively receives power from only one of the first power supply or from the second power supply depending on the status signal.

6. The power supply cabinet according to claim 5, wherein each of the power supply modules further includes:
   a first switching circuit electrically connected to the first power supply and the power circuit; and
   a second switching circuit electrically connected to the second power supply and the power circuit,
   wherein the status signal includes a first switching signal and a second switching signal,
   wherein the control circuit supplies the first switching signal to the first switching circuit, and supplies the second switching signal to the second switching circuit, such that the first switching circuit and the second switching circuit are in complementary conduction, and
   wherein when the first switching circuit is turned on, the power circuit is electrically connected to the first power supply, and when the second switching circuit is turned on, the power circuit is electrically connected to the second power supply.

7. The power supply cabinet according to claim 1, wherein
   when both the first power supply and the second power supply are AC power supplies, the power supply cabinet operates in the first power supply mode, and
   when the first power supply is an AC power supply, and the second power supply is a DC power supply, the power supply cabinet operates in the second power supply mode.

8. The power supply cabinet according to claim 1, wherein the position setting unit is disposed on a back plate of the power supply cabinet.

* * * * *